US007368773B2

(12) United States Patent
Koyama

(10) Patent No.: US 7,368,773 B2

(45) Date of Patent: May 6, 2008

(54) PHOTODETECTOR DEVICE, SOLID-STATE IMAGING DEVICE, AND CAMERA SYSTEM

(75) Inventor: Eiji Koyama, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 334 days.

(21) Appl. No.: 11/019,512

(22) Filed: Dec. 23, 2004

(65) Prior Publication Data

US 2005/0167771 A1 Aug. 4, 2005

(30) Foreign Application Priority Data

Dec. 26, 2003 (JP) ............................ 2003-435849

(51) Int. Cl.
*H01L 31/062* (2006.01)

(52) U.S. Cl. ...................... 257/292; 257/291; 257/293; 257/443; 257/461; 257/E27.133

(58) Field of Classification Search ........ 257/290–293, 257/443, 461, 463, E27.132, E27.133
See application file for complete search history.

(56) References Cited

U.S. PATENT DOCUMENTS 5,363,000 A * 11/1994 Miyatake et al. ........... 327/350
7,009,649 B2 * 3/2006 Watanabe .................. 348/308

FOREIGN PATENT DOCUMENTS

JP 2001-245214 9/2001
JP 2003-158683 5/2003

* cited by examiner

*Primary Examiner*—Matthew E. Warren
(74) *Attorney, Agent, or Firm*—Harness, Dickey & Pierce, PLC

(57) ABSTRACT

A photodetector device is provided which comprises a photodiode for generating an electrical signal corresponding to an amount of incident light, and a logarithmic conversion transistor for subjecting a voltage value of the electrical signal to logarithmic conversion. The logarithmic conversion transistor comprises a first electrode which is one of a source electrode and a drain electrode, a second electrode which is the other of the source electrode and the drain electrode, and a gate electrode. The first electrode is connected to the photodiode. A first voltage is applied to the second electrode so that the logarithmic conversion transistor operates in a subthreshold region. The photodetector device further comprising a section for causing a voltage of the gate electrode to be in a floating state when the logarithmic conversion transistor subjects the voltage value of the electrical signal to logarithmic conversion.

13 Claims, 11 Drawing Sheets

100
Vdd
Cgd
Cgs
103 104
Cgb
102 105
Vout
101

Vout
Vdd
103
105a
104a
GP
N+
N+
3Lum
Lum
P well
101
102

200
213
213
SEL
SW
Vdd
Vdd
400
103
104
416
102
105
Vout
411
412
414
415
101
Vertical scanning circuit portion
201
202
Horizontal scanning circuit portion 300
213
SEL
SW
Vd
Vdd
600
103
104
416
102
105
Vout
411
412
815
101
SW
Vertical scanning circuit portion
201a
202
Horizontal scanning circuit portion

PHOTODETECTOR DEVICE, SOLID-STATE IMAGING DEVICE, AND CAMERA SYSTEM

This nonprovisional application claims priority under 35 U.S.C. §119(a) on Patent Application No. 2003-435849 filed in Japan on Dec. 26, 2003, the entire contents of which are hereby incorporated by reference.

BACKGROUND OF THE INVENTION

1. Field of the Invention

The present invention relates to a photodetector device, a solid-state imaging device comprising a plurality of the photodetector devices, and a camera system comprising the solid-state imaging device.

2. Description of the Related Art

Semiconductor image sensors (e.g., CCD and MOS image sensors, etc.) have been applied to a number of image input devices. Particularly, in recent years, MOS image sensors have been reviewed and have attracted attention because their power consumption is low and they can be produced using the same CMOS technology as that which is used for their peripheral circuitry. In the field of MOS image sensors, attention has been paid to a so-called logarithm conversion image sensor. The logarithm conversion image sensor utilizes a subthreshold region of a MOS transistor, has logarithmic characteristics of the amount of irradiation and the output, and operates in a high dynamic range (see, for example, Japanese Laid-Open Publication No. 2003-158683).

FIG. 10 shows a photodetector device 900 which is provided in each unit pixel of a logarithm conversion image sensor. In the photodetector device 900, an output voltage Vout is determined so that a photocurrent Ipd generated by a photodiode 901 is balanced with a subthreshold current Ids of a logarithmic conversion MOS transistor 902.

The subthreshold current Ids of the MOS transistor 902 is represented by:

$$Ids=Io\times\exp((\phi g-Vs)q/kT) \quad (1)$$

where Io is a proportionality factor, q is the charge per electron, k is the Boltzmann constant, T is an absolute temperature, $\phi g$ is a surface potential of a lower portion of the gate, and Vs is a potential of the source.

The relationship between a gate voltage Vg and the surface potential $\phi g$ is represented by:

$$Vg=m\phi g+a \quad (2)$$

where $m=dVg/d\phi g=1+Cd/Cox\approx 1.1$ (Cox: oxide capacitance, Cd: capacitance of a depletion layer below the gate), and a is a constant. According to expressions (1) and (2), expression (3) is obtained:

$$Ids=Io\times\exp(((Vg-a)/m-Vs)q/kT) \quad (3).$$

Assuming that Ids=Ipd and Vg=Vdd according to FIG. 10, Vout (=Vs) is represented by:

$$\mathrm{Vout}=(Vdd-a)/m-(kT/q)\ln(Ipd/Io) \quad (4).$$

As can be seen, the output Vout and the photocurrent Ipd have logarithmic characteristics. When different amounts of light generate photocurrents Ipd1 and Ipd2 and the resulting output voltages are Vout1 and Vout2, the following expression is obtained:

$$\mathrm{Vout2}-\mathrm{Vout1}=-(kT/q)\ln(Ipd2/Ipd1) \quad (5).$$

For example, when it is assumed that the amount of light is increased by a factor of 10 at room temperature (i.e., Ipd2=Ipd1×10), the following expression is obtained:

$$\mathrm{Vout2}-\mathrm{Vout1}=-(kT/q)\ln(10)\approx-60\ mV \quad (6).$$

This expression indicates that the amount of change in the output voltage with respect to the rate of change in the amount of light depends only on the absolute temperature, i.e., has a constant value. When the rate of change in the amount of light is assumed to be $\alpha$, the amount of change in the output voltage is represented by:

$$\Delta\mathrm{Vout}=-(kT/q)\ln(\alpha) \quad (7).$$

Note that an image sensor is composed of a plurality of photodetector devices arranged in a two-dimensional manner, each photodetector device may have a structure as shown in FIG. 11 (photodetector device 910). The photodetector device 910 comprises a pixel amplifier 911 for impedance conversion and a row selection switch portion 912 in addition to the components of the photodetector device 900. A signal is generally output on a row-by-row basis. In the photodetector device 910, when a voltage is applied to a signal line SEL, the row selection switch portion 912 is switched ON, so that a signal output from the pixel amplifier 911 is output onto a column output line 913.

MOS transistor characteristics vary between each logarithmic conversion MOS transistor 902, which operates in a subthreshold region. Therefore, it is known that when an operating point of the logarithmic conversion MOS transistor 902 varies between each pixel, so-called two-dimensional fixed pattern noise occurs. To reduce the fixed pattern noise, a circuit for outputting a difference between an output signal and a reset signal in each pixel (CDS circuit) is provided (see, for example, Japanese Laid-Open Publication No. 2001-245214).

FIG. 12 shows a photodetector device 920. The photodetector device 920 comprises the components of the photodetector device 910, and in addition, a constant current power source 914, and a switch portion 915, which is connected to the constant current power source 914 and the logarithmic conversion MOS transistor 902.

FIG. 13 shows an example of driving pulse timing of the photodetector device 920. At output signal read time t1, a SEL switch is switched into conduction to output an output signal onto a column output line. In this case, the waveform of Vout has a high potential in the dark and a low potential in the light.

Next, at time t2, the switch portion 915 is switched into conduction so that the constant current power source 914 generating a constant current which is much larger than the output signal is brought into conduction with the source electrode of the logarithmic conversion MOS transistor 902. As a result, a source follower circuit whose input is Vdd is formed. This situation is equivalent to when an excessive amount of light is incident to the photodiode 901, and the potential of Vout is sufficiently lowered no matter whether it is in the dark or light.

Thereafter, at time t3, the SEL switch is switched into conduction, and when the potential of Vout is sufficiently lowered, an output signal is output as a reset signal to the column output line 913. The reset signal contains a variation in characteristics of the logarithmic conversion MOS transistor 902 (more specifically, also a variation in characteristics of the pixel amplifier 911) Therefore, a subsequent CDS circuit (not shown) is used to cancel the characteristics variation of the logarithmic conversion MOS transistor 902 in each pixel, resulting in a reduction in the fixed pattern noise. At time t4 and thereafter, the switch portion 915 is switched OFF, and an ordinary photodetection is continued until the next read operation (after one frame period).

In the above-described conventional photodetector device, when the rate of change in the amount of light is 10-fold, the amount of change in the output voltage is about 60 mV according to expression (6). An upper limit of an incident light amount range in which a photodetector device can operate is an amount of light (high luminance) which generates a large current which causes the operation of a logarithmic conversion MOS transistor to deviate from the subthreshold region. A lower limit of the incident light amount range is an amount of light (low luminance) which generates a small current in which a dark current component generated in the photodiode is not negligible. The light amount range is about 160 dB($=10^8$). Therefore, the amount of change in the output voltage is only about 60 mV×8=480 mV. Compared to conventional linear conversion image sensor in which the amount of change in the output voltage is about 1 V, the logarithm conversion image sensor has an insufficient dynamic range of the output signal. In the case of the logarithm conversion image sensor, a gain is inevitably increased using an analog amplifier in order to A/D convert an output signal efficiently, leading to a large noise and thus a degradation in image quality. As described above, the logarithm conversion image sensor disadvantageously has a small absolute amount of change in the output voltage compared to conventional linear conversion image sensors.

SUMMARY OF THE INVENTION

According to an aspect of the present invention, a photodetector device is provided which comprises a photodiode for generating an electrical signal corresponding to an amount of incident light, and a logarithmic conversion transistor for subjecting a voltage value of the electrical signal to logarithmic conversion. The logarithmic conversion transistor comprises a first electrode which is one of a source electrode and a drain electrode, a second electrode which is the other of the source electrode and the drain electrode, and a gate electrode. The first electrode is connected to the photodiode. A first voltage is applied to the second electrode so that the logarithmic conversion transistor operates in a subthreshold region. The photodetector device further comprising a section for causing a voltage of the gate electrode to be in a floating state when the logarithmic conversion transistor subjects the voltage value of the electrical signal to logarithmic conversion.

In one embodiment of the present invention, a capacitance between the first electrode and the gate electrode is larger than a capacitance between the second electrode and the gate electrode.

In one embodiment of the present invention, a width of an overlap between the gate electrode and the first electrode is greater than a width of an overlap between the gate electrode and the second electrode.

In one embodiment of the present invention, an area of an overlap between the gate electrode and the first electrode is larger than an area of an overlap between the gate electrode and the second electrode.

In one embodiment of the present invention, an area of an overlap between the gate electrode and the first electrode is larger than an area of an overlap between the gate electrode and the second electrode.

In one embodiment of the present invention, the photodetector device further comprises an amplifier section for amplifying the electrical signal having the voltage value which has been subjected to logarithmic conversion by the logarithmic conversion transistor, and a first switch portion connected to the amplifier section. The amplifier section outputs the amplified electrical signal via the first switch portion.

In one embodiment of the present invention, the section for causing the voltage of the gate electrode to be in the floating state is a second switch portion connected to the gate electrode. When the second switch portion is ON, a second voltage is applied to the gate electrode, and when the second switch portion is OFF, the voltage of the gate electrode is caused to be in the floating state.

In one embodiment of the present invention, the photodetector device further comprises a constant current power source section for generating a constant current, and a third switch portion connected to the first electrode and the constant current power source section. When the third switch portion is ON, the constant current is input to the first electrode.

In one embodiment of the present invention, when the second switch portion and the third switch portion are ON, the logarithmic conversion transistor generates a reset signal.

In one embodiment of the present invention, when the second switch portion is ON and the first voltage goes to a high level after having once been lowered to a low level, the logarithmic conversion transistor generates a reset signal.

In one embodiment of the present invention, the photodetector device further comprises a fourth switch portion connected to the first electrode and the photodiode. When the fourth switch portion is ON, the electrical signal is input to the first electrode.

In one embodiment of the present invention, when the fourth switch portion is OFF, the logarithmic conversion transistor generates a reset signal.

According to another aspect of the present invention, a solid-state imaging device is provided which comprises a plurality of photodetector devices. Each of the plurality of photodetector devices comprises a photodiode for generating an electrical signal corresponding to an amount of incident light, and a logarithmic conversion transistor for subjecting a voltage value of the electrical signal to logarithmic conversion. The logarithmic conversion transistor comprises a first electrode which is one of a source electrode and a drain electrode, a second electrode which is the other of the source electrode and the drain electrode, and a gate electrode. The first electrode is connected to the photodiode. A first voltage is applied to the second electrode so that the logarithmic conversion transistor operates in a subthreshold region. The photodetector device further comprising a section for causing a voltage of the gate electrode to be in a floating state when the logarithmic conversion transistor subjects the voltage value of the electrical signal to logarithmic conversion.

According to another aspect of the present invention, a camera system is provided which comprising a solid-state imaging device. The solid-state imaging device comprises a plurality of photodetector devices. Each of the plurality of photodetector devices comprises a photodiode for generating an electrical signal corresponding to an amount of incident light, and a logarithmic conversion transistor for subjecting a voltage value of the electrical signal to logarithmic conversion. The logarithmic conversion transistor comprises a first electrode which is one of a source electrode and a drain electrode, a second electrode which is the other of the source electrode and the drain electrode, and a gate electrode. The first electrode is connected to the photodiode.

A first voltage is applied to the second electrode so that the logarithmic conversion transistor operates in a subthreshold region. The photodetector device further comprising a section for causing a voltage of the gate electrode to be in a floating state when the logarithmic conversion transistor subjects the voltage value of the electrical signal to logarithmic conversion.

According to the present invention, when the logarithmic conversion transistor subjects the voltage value of an electrical signal generated by the photodiode to logarithmic conversion, the voltage of the gate electrode of the logarithmic conversion transistor is caused to be in a floating state. Therefore, the voltage value of the electrical signal generated by the photodiode can have a large dynamic range, and the amount of change in voltage value of the electrical signal in association with a change in the amount of incident light can be increased. As a result, a high-sensitivity photodetector device can be achieved, thereby making it possible to obtain an image having high image quality.

Thus, the invention described herein makes possible the advantages of (1) providing a photodetector device in which, when the logarithmic conversion transistor subjects the voltage value of an electrical signal generated by the photodiode to logarithmic conversion, the voltage of the gate electrode of the logarithmic conversion transistor is caused to be in a floating state, and therefore, the voltage value of the electrical signal generated by the photodiode can have a large dynamic range, and the amount of change in voltage value of the electrical signal in association with a change in the amount of incident light can be increased; (2) a solid-state imaging device comprising a plurality of the photodetector devices; and (3) a camera system comprising the solid-state imaging device.

These and other advantages of the present invention will be come apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Embodiment 1

Figure 1:
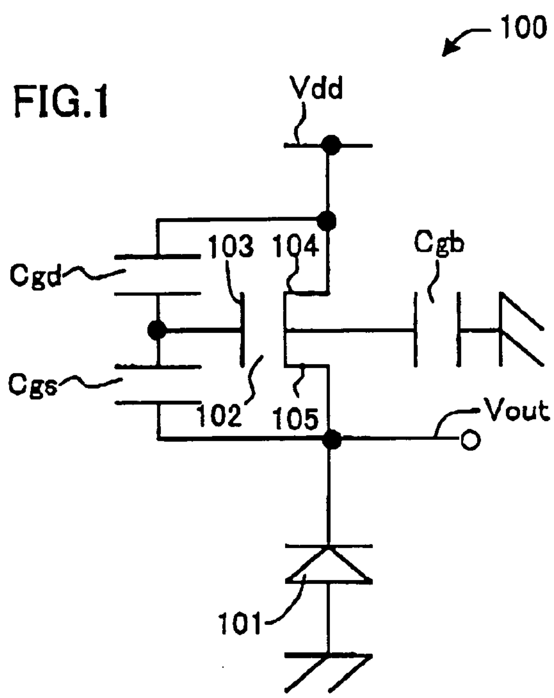
FIG. 1 is a diagram showing a photodetector device according to Embodiment 1 of the present invention.

FIG. 1 shows a photodetector device 100 according to Embodiment 1 of the present invention.

The photodetector device 100 comprises a photodiode 101 which outputs an electrical signal corresponding to the amount of incident light, and a logarithmic conversion transistor 102 which subjects a voltage value of the electrical signal generated by the photodiode 101 to logarithmic conversion. The logarithmic conversion transistor 102 is, for example, a MOS transistor, which comprises a first electrode 105 which is one of a source electrode and a drain electrode, a second electrode 104 which is the other of the source electrode and the drain electrode, and a gate electrode 103. In Embodiment 1 of the present invention, the first electrode 105 is a source electrode and the second electrode 104 is a drain electrode, but may be reversed depending on the circuit structure. The source electrode 105 is connected to the photodiode 101. In order to operate the logarithmic conversion transistor 102 in a subthreshold region, a predetermined voltage is applied via a power source line Vdd to the drain electrode 104. The gate electrode 103 is connected to the power source line Vdd.

The photodetector device 100 comprises a means for causing a voltage of the gate electrode 103 to enter into a floating state when the logarithmic conversion transistor 102 subjects the voltage value of the electrical signal generated by the photodiode 101 to logarithmic conversion. In the photodetector device 100, a structure in which the power source line Vdd is not connected to the gate electrode 103 corresponds to the means for causing the voltage of the gate electrode 103 to enter into a floating state.

In conventional logarithmic conversion transistors, the gate electrode is connected to the power source line Vdd. In contrast, the gate electrode 103 of the photodetector device 100 of the present invention is not connected to the power source line Vdd, i.e., it is in a floating state in terms of its potential. In this case, a capacitance (coupling capacitance) between the gate electrode 103 and the drain electrode 104 is represented by Cgd, a capacitance (coupling capacitance) between the gate electrode 103 and the source electrode 105 is represented by Cgs, and a capacitance (coupling capacitance) between the gate electrode 103 and a substrate is represented by Cgb. When a certain amount of light is assumed to generate an output signal voltage Vout, a photocurrent Ipd, and a gate voltage Vg, the photocurrent Ipd is represented according to expression (8), by:

$$Ipd=Io\times\exp(((Vg-a)/m-\mathrm{Vout})q/kT) \tag{8}$$

When the amount of light is changed by a factor of $\alpha$, expression (8) is modified into:

$$\alpha\times Ipd=Io\times\exp(((vg+mydelta\Delta vg-a)/m-(\mathrm{Vout}+\Delta\mathrm{Vout}))q/kT) \tag{9}$$

where ΔVout represents an amount of change in Vout, and ΔVg represents an amount of change in Vg.

The coupling capacitance component of the gate electrode 103 is represented by β. If β=Cgs/(Cgd+Cgs+Cgb) and 0<β<1, then ΔVg=ΔVout=β. According to expressions (8) and (9), ΔVout is represented by:

$$\Delta Vout = -(kT/q)\ln(\alpha)/(1-\beta/m) \quad (10).$$

As compared to expression (7), the term 1/(1−β/m) is multiplied to obtain expression (10). Typically, in the sub-threshold region, Cgd=Cgs and Cgb<<Cgs, and therefore, β≈0.5 and m=1.1. In this case, ΔVout is represented by:

$$\Delta Vout = -(kT/q)\ln(\alpha)\times 1.8 \quad (11).$$

According to expression (11), the photodetector device 100 can magnify the amount of change in voltage of the output signal by 1.8. Therefore, when the range of change in the amount of light is 160 dB (=$10^8$), the amount of change in voltage of the output signal is about 60 mV×1.8×8=860 mV, which is about the same as the amount of change in voltage of the output signal (about 1 V) of conventional linear conversion image sensors. In addition to this, the amount of change in voltage of the output signal with respect to the amount of change in light is increased by a factor of 1.8, so that the sensitivity is also improved by a factor of 1.8.

As described above, in the photodetector device 100 of Embodiment 1, the dynamic range of the voltage value of an electrical signal generated by the photodiode 101 can be increased and the amount of change in the voltage value of the electrical signal in association with a change in the amount of incident light can be increased, thereby making it possible to detect light with high sensitivity.

Note that the coupling capacitance Cgs may be larger than the coupling capacitance Cgd in order to further increase the amount of change in the output voltage. By changing the layout of the gate electrode 103, the source electrode 105, and the drain electrode 104, the size ratio of the coupling capacitance Cgs to the coupling capacitance Cgd can be changed.

Figure 2:
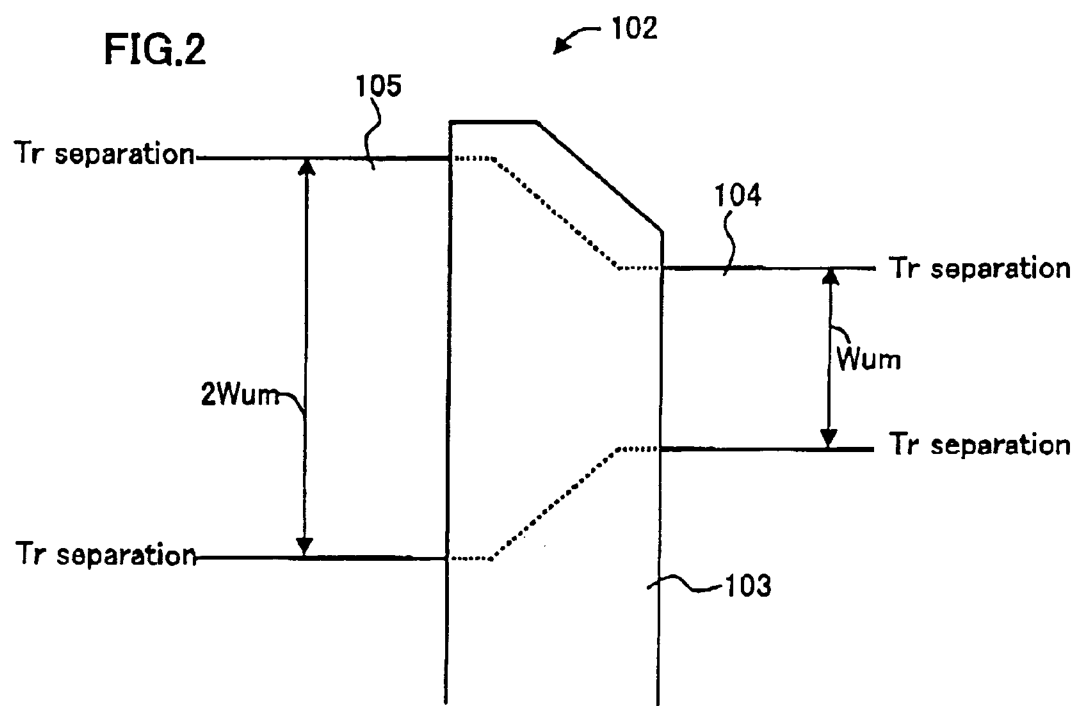
FIG. 2 is a top view of a logarithmic conversion transistor according to Embodiment 1 of the present invention.

FIG. 2 is a top view of the logarithmic conversion transistor 102. In FIG. 2, a gate width 2Wum of the logarithmic conversion transistor 102 (i.e., a width of an overlap between the gate electrode 103 and the source electrode 105) is about two times greater than a gate width Wum of the logarithmic conversion transistor 102 (i.e., a width of an overlap between the gate electrode 103 and the drain electrode 104). The diffused area below the gate electrode 103 of the source electrode 105 is larger than the diffused area below the gate electrode 103 of the drain electrode 104.

In the example of FIG. 2, β and ΔVout are respectively represented by:

$$\beta \approx Cgs/(Cgd+Cgs) = 0.67 \quad (12) \text{ and}$$

$$\Delta Vout = -(kT/q)\ln(\alpha)\times 2.5 \quad (13).$$

According to expression (13), when the range of the change in light is 160 dB (=$10^8$), the amount of change in the voltage of the output signal can be further increased to 60 mV×2.5×8=1200 mV, and the sensitivity can be improved by a factor of 2.5.

Figure 3:
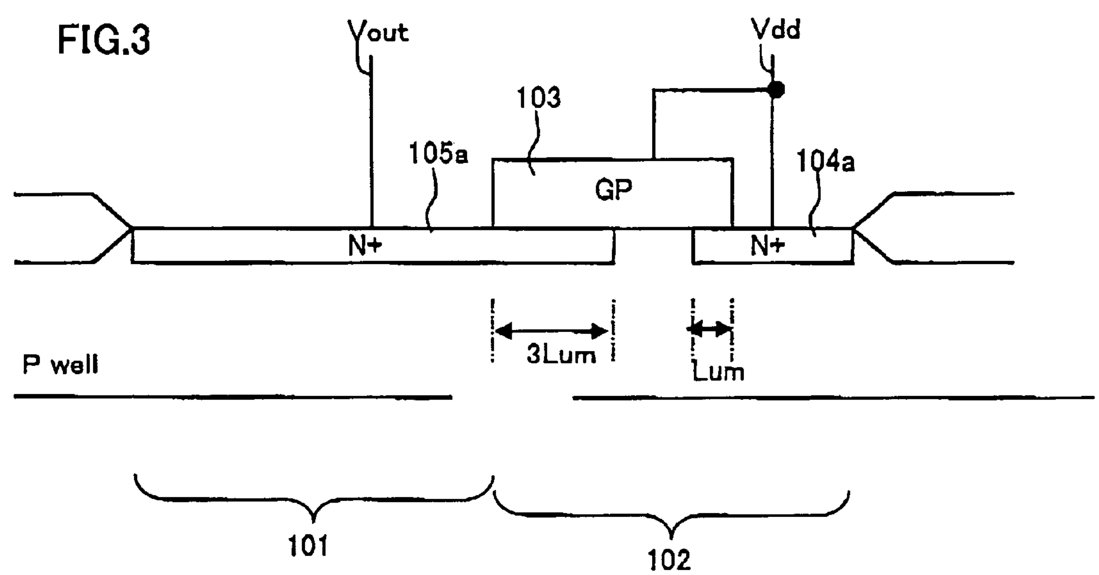
FIG. 3 is a cross-sectional view showing the logarithmic conversion transistor of Embodiment 1 of the present invention.

FIG. 3 is a cross-sectional view showing the logarithmic conversion transistor 102. In the example of FIG. 3, an overlap between a high concentration diffusion region 105*a* serving as the source electrode 105 and the gate electrode 103 has a length of 3 Lum, which is about three times greater than a length Lum of an overlap between a high concentration diffusion region 104*a* serving as the drain electrode 104 and the gate electrode 103. Also, by changing the length of the overlap, the diffused area below the gate electrode 103 of the source electrode 105 can be caused to be larger than the diffused area below the gate electrode 103 of the drain electrode 104, and thus, the coupling capacitance Cg scan be caused to be larger than the coupling capacitance Cgd. In the example of FIG. 3 (assuming that the gate width of the drain side is the same as the gate width of the source side), β and ΔVout are represented by:

$$\beta \approx Cgs/(Cgd+Cgs) = 0.75 \quad (14) \text{ and}$$

$$\Delta Vout = -(kT/q)\ln(\alpha)\times 3.1 \quad (15).$$

According to expression (15), the range of change in light is 160 dB(=$10^8$), the amount of change in voltage of the output signal can be increased to a relatively large value, i.e., 60 mV×3.1×8=1490 mV. In this case, the sensitivity is increased by a factor of 3.1.

Alternatively, by providing a capacitor device between the gate electrode 103 and the source electrode 105 and between the gate electrode 103 and the drain electrode 104, the amount of change in voltage of the output signal can be increased in a manner similar to that described above.

Embodiment 2

Figure 4:
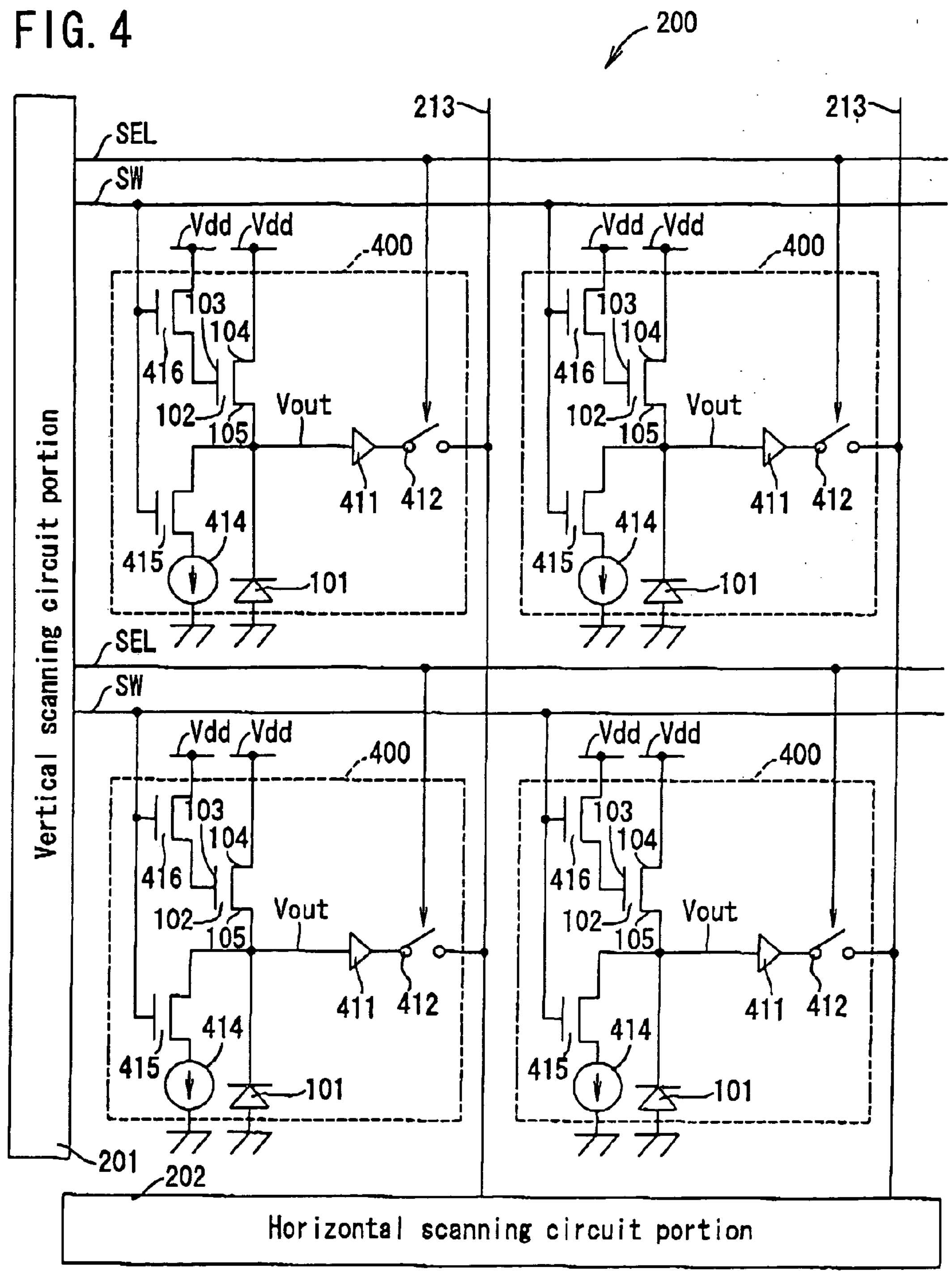
FIG. 4 is a diagram showing a solid-state imaging device according to Embodiment 2 of the present invention.

FIG. 4 shows a solid-state imaging device 200 according to Embodiment 2 of the present invention. The solid-state imaging device 200 comprises a plurality of photodetector devices 400 arranged in a two-dimensional manner, a vertical scanning circuit portion 201, and a horizontal scanning circuit portion 202. Although FIG. 4 shows only four photodetector devices 400 for the sake of brevity, the number of photodetector devices 400 may be selected arbitrarily. For example, if the number of pixels in the solid-state imaging device 200 is five million, the solid-state imaging device 200 comprises about five million photodetector devices 400.

The photodetector device 400 comprises the components of the photodetector device 100, and in addition to these, an amplifier portion 411 for amplifying an output voltage Vout which is a voltage of an electrical signal obtained by logarithmic conversion, a row selection switch portion 412, a constant current power source 414 for generating a constant current, a switch portion 415 connected to the constant current power source 414 and the logarithmic conversion transistor 102, and a switch portion 416 connected to the gate electrode 103 and the power source line Vdd.

The vertical scanning circuit portion 201 selects the photodetector devices 400 on a row-by-row basis. The horizontal scanning circuit portion 202 selects the photodetector devices 400 on a column-by-column basis. The vertical scanning circuit portion 201 and the horizontal scanning circuit portion 202 function as a control section for controlling operations of the photodetector devices 400. The vertical scanning circuit portion 201 controls a voltage value of a predetermined line of a plurality of lines SEL to switch ON/OFF the row selection switch portion 412 connected to the predetermined line SEL. When the row selections witch portion 412 is switched ON, an output signal output to a column output line 213 is input to the horizontal scanning circuit portion 202. The vertical scanning circuit portion 201 controls a voltage value of a predetermined one of a plurality of lines SW to switch ON/OFF states of the switch portions 415 and 416 connected to the predetermined line SW. When the switch portion 415 is OFF, an electrical signal output from the photodiode 101 is input to the source electrode 105. A constant current output from the constant current power source 414 is not input to the source electrode 105. Therefore, the logarithmic conversion MOS transistor 102 subjects the electrical signal output from the photodiode 101 to logarithmic conversion. Also, when the switch portion 415 is OFF, the switch portion 416 is also OFF at the same time. The power source line Vdd and the gate electrode 103 are electrically disconnected, causing the voltage of the gate electrode 103 to be in a floating state. Thus, the switch portion 416 functions as a means for causing the voltage of the gate electrode 103 to be in the floating state when the logarithmic conversion transistor 102 subjects the voltage value of the electrical signal output from the photodiode 101 to logarithmic conversion.

Figure 5:
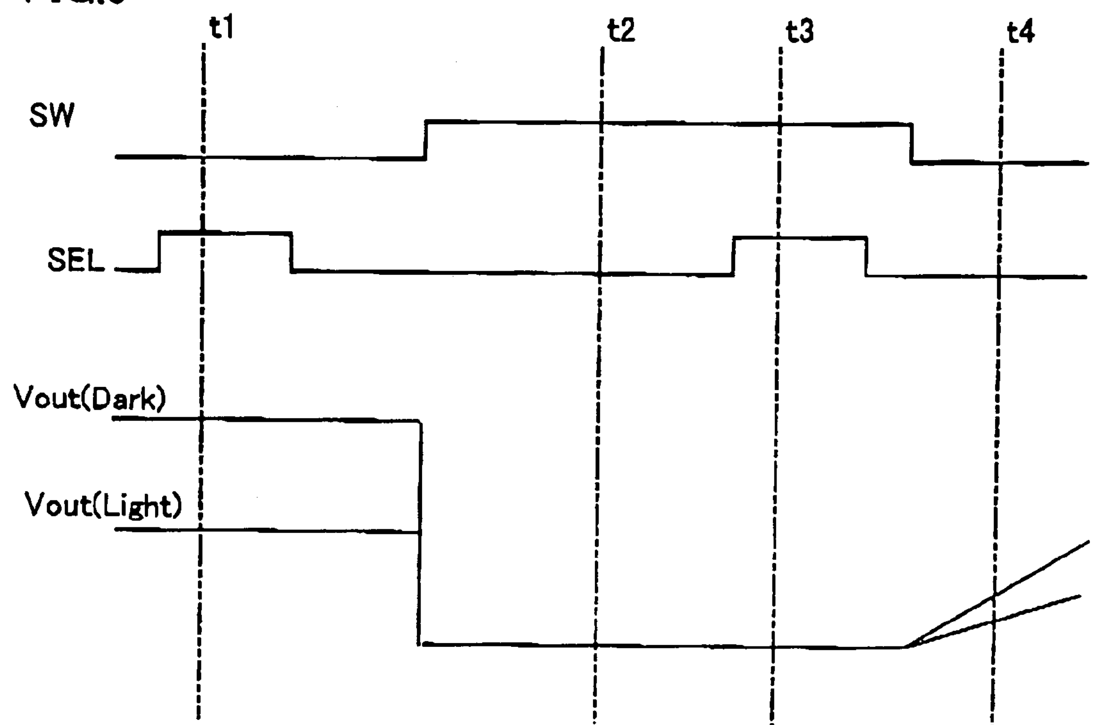
FIG. 5 is a diagram showing a driving pulse timing of the solid-state imaging device of Embodiment 2 of the present invention.

FIG. 5 shows a driving pulse timing of the solid-state imaging device 200. An operation of the solid-state imaging device 200 will be described with reference to FIGS. 4 and 5.

Figure 13:
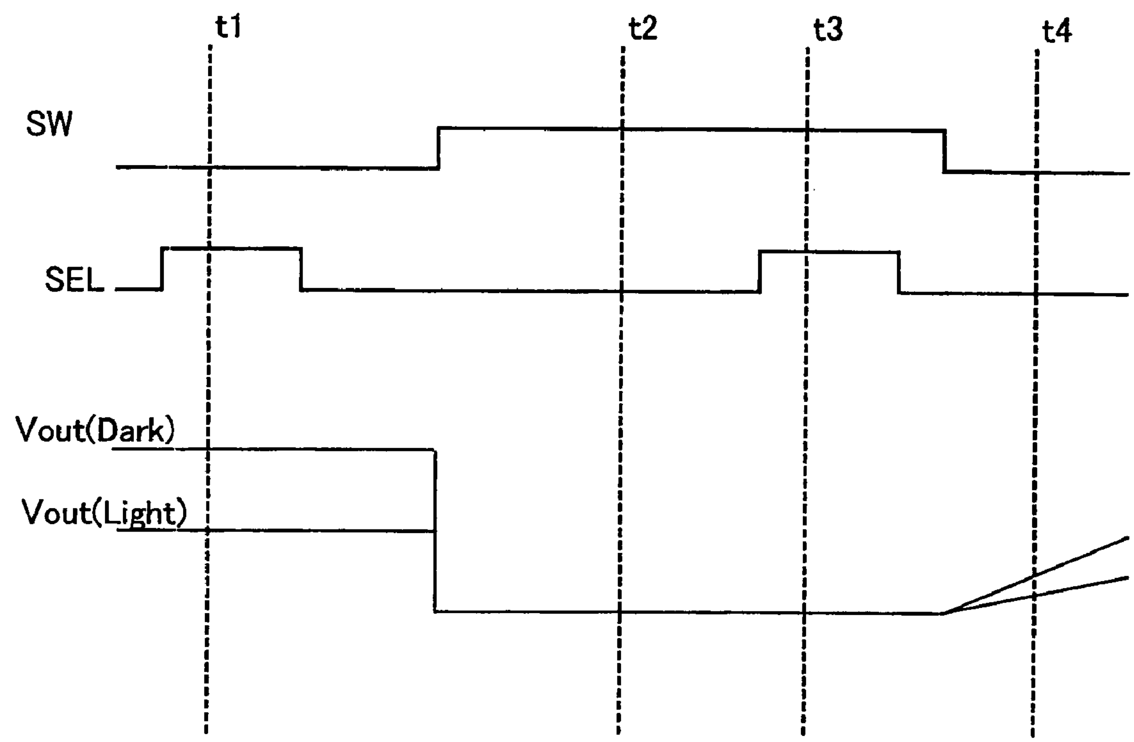
FIG. 13 is a diagram showing a driving pulse timing of the photodetector device of FIG. 12.

In order to cause the gate electrode 103 of the logarithmic conversion transistor 102 to be in the floating state, it is necessary to fix the gate electrode 103 to a predetermined potential at intervals of a predetermined period of time. At output signal read time t1, the gate electrode 103 of the logarithmic conversion transistor 102 is in the floating state and the row selection switch portion 412 is switched ON to output an output signal. In this case, the waveform of Vout has a high potential in the dark and a low potential in the light, as in FIG. 13.

Next, at time t2, the switch portions 415 and 416 are switched ON to bring the constant current power source 414 and the source electrode 105 into conduction to form a source follower circuit. The constant current power source 414 and the source electrode 105 generate a constant current which is sufficiently large compared to the output signal. At the same time, the gate electrode 103 of the logarithmic conversion transistor 102 is fixed to the voltage of the power source line Vdd. This situation is equivalent to when an excessive amount of light is incident to the photodiode 101, and the potential of Vout is sufficiently lowered no matter whether it is in the dark or light.

Thereafter, at time t3, the row selection switch portion 412 is switched ON. When the value of the voltage Vout is sufficiently lowered, an output signal generated by the logarithmic conversion transistor 102 is output as a reset signal to the column output line 213.

The reset signal contains a variation in characteristics of the logarithmic conversion transistor 102 (more specifically, also a variation in characteristics of the pixel amplifier 411). Therefore, a subsequent CDS circuit (not shown) is used to cancel the characteristics variation of the logarithmic conversion MOS transistor 102 in each pixel, resulting in a reduction in the fixed pattern noise. At time t4 and thereafter, the switch portions 415 and 416 are OFF so that the gate electrode 103 is caused to be in the floating state, and an ordinary photodetection is continued until the next read operation (after one frame period).

Embodiment 3

Figure 6:
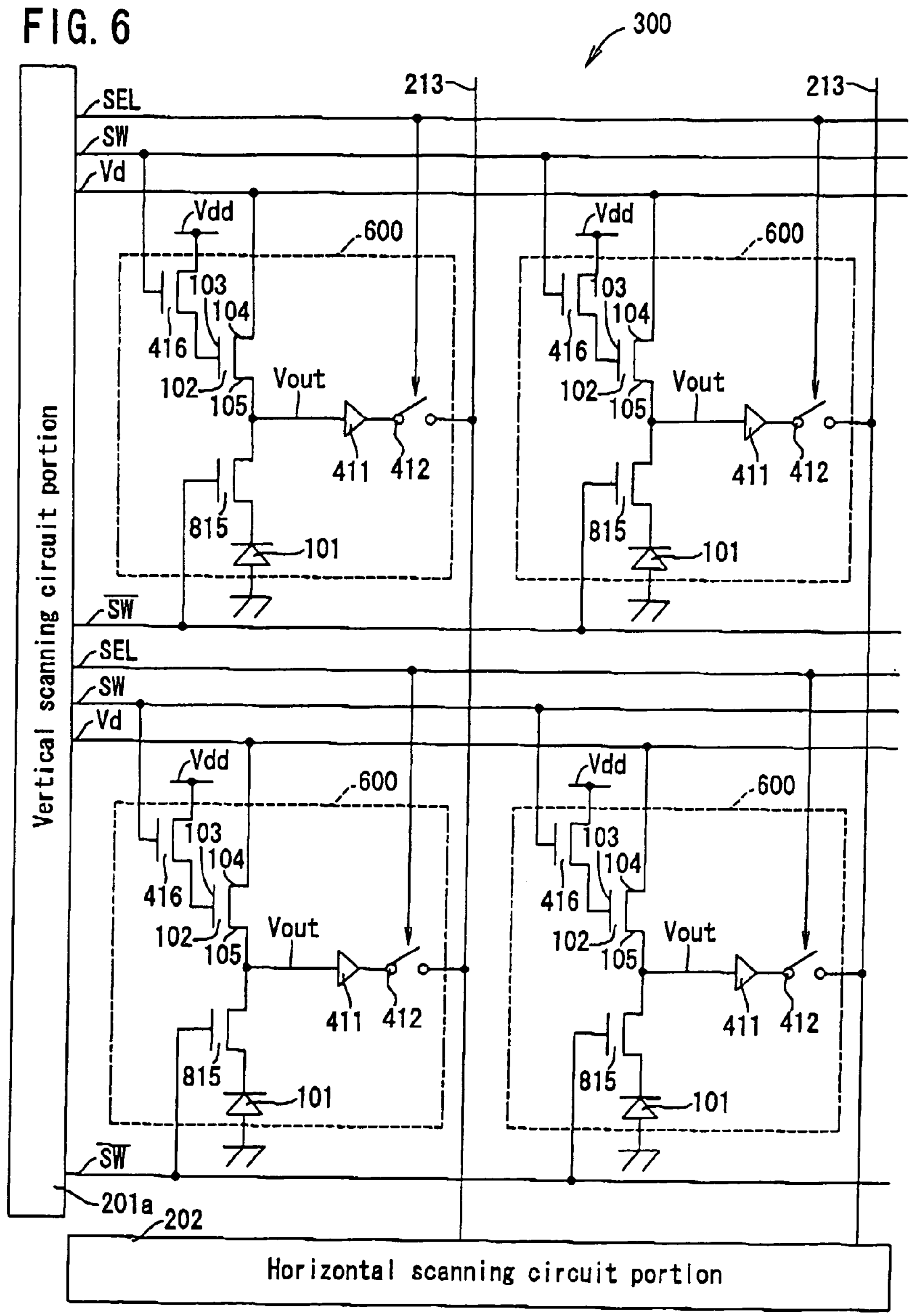
FIG. 6 is a diagram showing a solid-state imaging device according to Embodiment 3 of the present invention.

FIG. 6 shows a solid-state imaging device 300 according to Embodiment 3 of the present invention. The solid-state imaging device 300 comprises a plurality of photodetector devices 600 arranged in a two-dimensional manner, a vertical scanning circuit portion 201*a*, and a horizontal scanning circuit portion 202. Although FIG. 6 shows only four photodetector devices 600 for the sake of brevity, the number of photodetector devices 600 may be selected arbitrarily. For example, if the number of pixels in the solid-state imaging device 300 is five million, the solid-state imaging device 300 comprises about five million photodetector devices 600.

In the photodetector device 600, the constant current power source 414 and the switch portion 415 are omitted from the components of the photodetector devices 400. The photodetector device 600 further comprises a switch portion 815 connected to the photodiode 101 and the source electrode 105. In Embodiment 3, the drain electrode 104 is connected to a power source line Vd extending from the vertical scanning circuit portion 201*a*. The gate electrode of the switch portion 815 is connected to a line/SW (/indicates a bar).

The vertical scanning circuit portion 201*a* controls a voltage value of a predetermined line of a plurality of lines SW to switch ON/OFF the switch portion 416 connected to the predetermined line SW. The vertical scanning circuit portion 201*a* also controls a voltage value of a predetermined line of a plurality of lines/SW to switch ON/OFF the switch portion 815 connected to the predetermined line/SW. The vertical scanning circuit portion 201*a* also controls a voltage value of a predetermined line of a plurality of lines SEL to switch ON/OFF the row selection switch portion 412 connected to the predetermined line SEL. When the row selection switch portion 412 is ON, an output signal output to the column output line 213 is input to the horizontal scanning circuit portion 202.

Strictly speaking, when the row selection switch portion 412 is switched ON to output a reset signal, the reset signal is affected by a photocurrent flowing through the photodiode 101 in the light or in the dark. To avoid such an influence, the photodetector device 600 comprises the switch portion 815 connected between the photodiode 101 and the source electrode 105 of the logarithmic conversion MOS transistor 102. The ON/OFF states of the switch portion 815 are switched by an inverted signal of a signal output to the line SW being output to the line/SW. Therefore, when the switch portion 416 is ON (i.e., when a reset signal is output), the switch portion 815 is OFF, so that the photodiode 101 and the source electrode 105 are separated. When the photodiode 101 and the source electrode 105 are separated, the logarithmic conversion transistor 102 outputs the reset signal. When the reset signal is output while the photodiode 101 and the source electrode 105 are separated, the reset signal is not affected by the photocurrent flowing through the photodiode 101, therefore a reset signal having a more accurate voltage value can be obtained.

Figure 7:
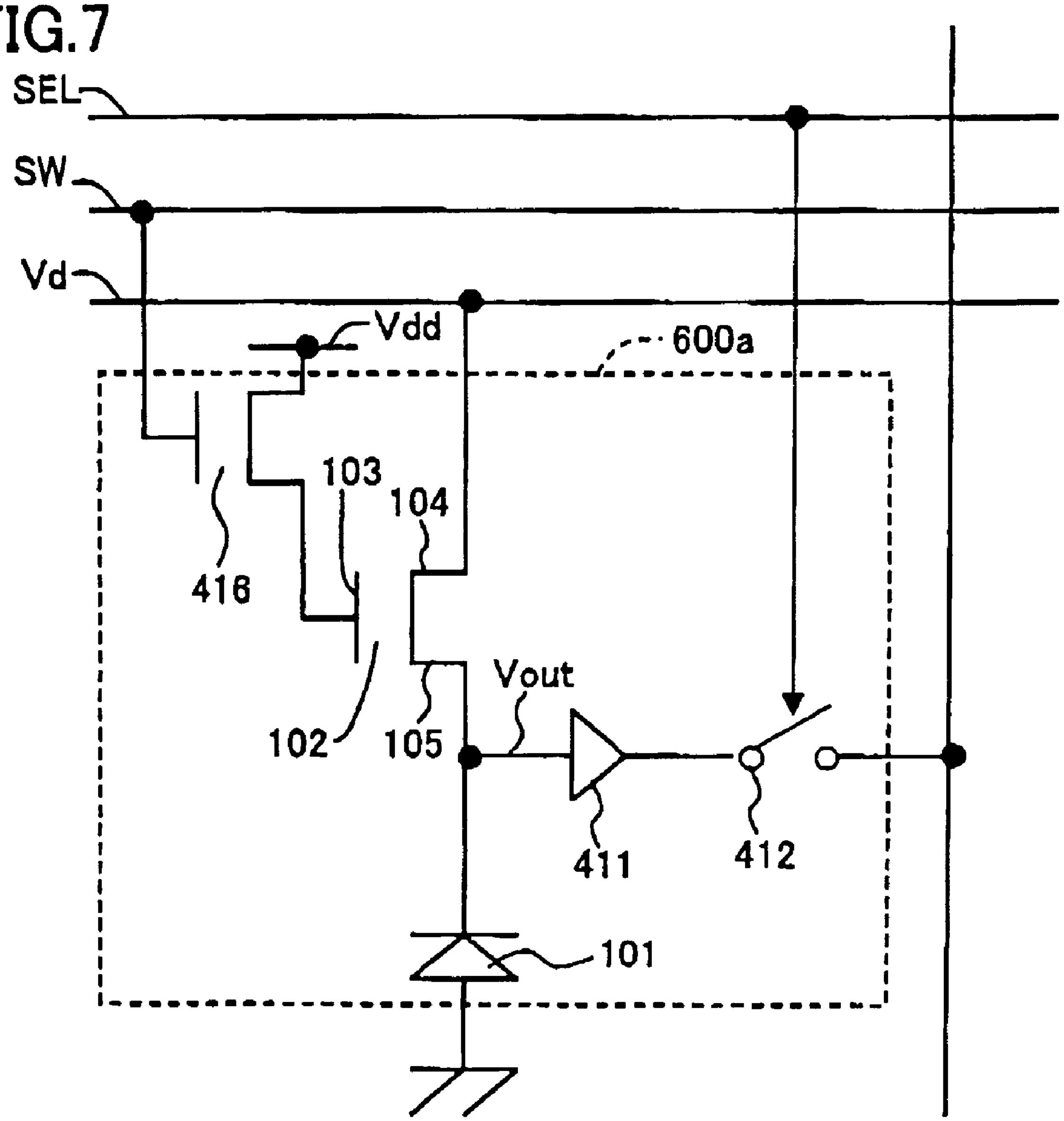
FIG. 7 is a diagram showing a photodetector device according to Embodiment 3 of the present invention.

FIG. 7 shows a photodetector device 600*a* which is a variation of the photodetector device 600. In the photodetector device 600*a*, the switch portion 815 is omitted from the components of the photodetector device 600. When the solid-state imaging device 300 comprises the photodetector device 600*a* instead of the photodetector device 600, the line/SW is omitted from the solid-state imaging device 300.

Figure 8:
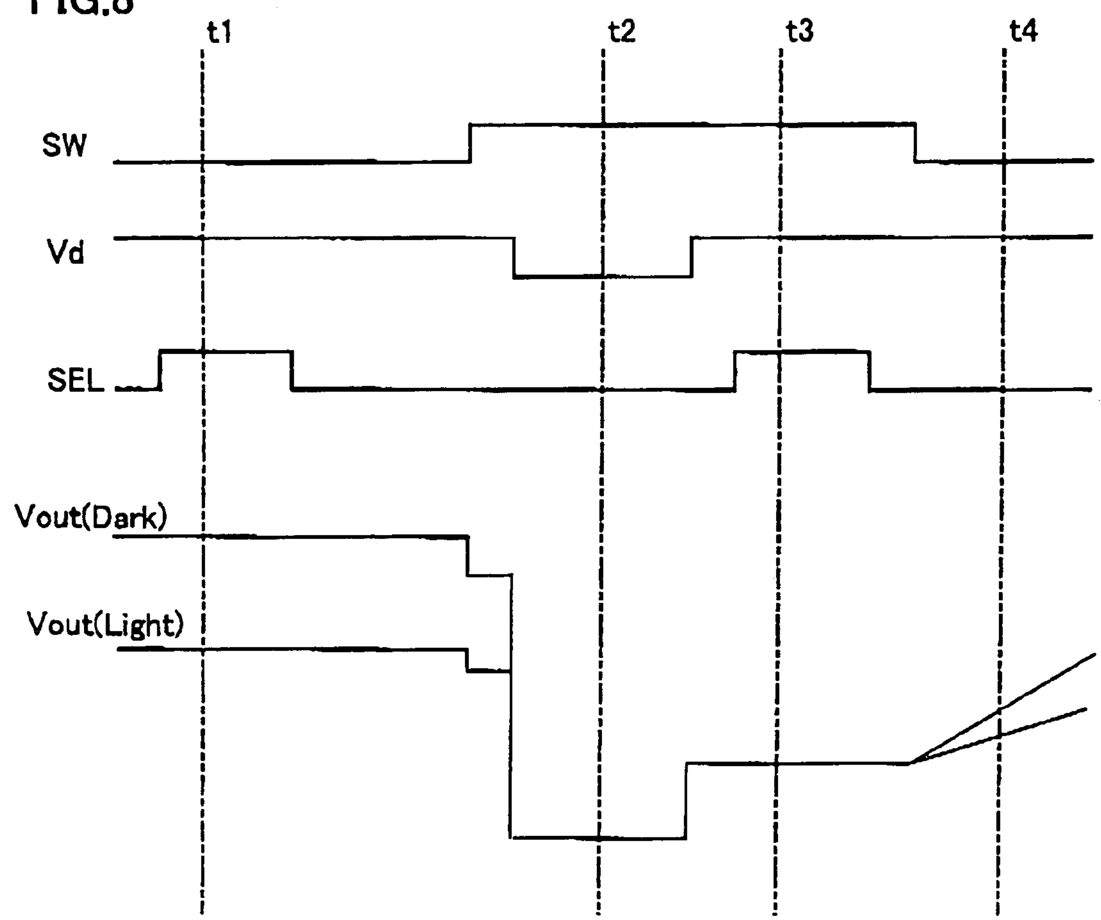
FIG. 8 is a diagram showing a driving pulse timing of the solid-state imaging device of Embodiment 3 of the present invention.

FIG. 8 shows a driving pulse timing of the solid-state imaging device 300 comprising the photodetector device 600*a*. In order to cause the gate electrode 103 of the logarithmic conversion transistor 102 to be in the floating state, it is necessary to fix the gate electrode 103 to a predetermined potential at intervals of a predetermined period of time. At output signal read time t1, the gate electrode 103 of the logarithmic conversion transistor 102 is in the floating state and the row selection switch portion 412 is switched ON to output an output signal. In this case, the waveform of Vout has a high potential in the dark and a low potential in the light, as in FIG. 5.

Next, at timing t2, the vertical scanning circuit portion 201*a* switches ON the switch portion 416 to fix the gate electrode 103 of the logarithmic conversion transistor 102 to the voltage of the power source line Vdd and lowers the voltage of the power source line Vd to a low level, thereby fixing the voltage Vout to a low level of voltage no matter whether it is in the light or in the dark. Thereafter, when the voltage of the power source line Vd is returned to a high level, a subthreshold current flows between the power source line Vd and the source electrode 105. At time t3, when the row selection switch portion 412 is switched ON, an output signal generated by the logarithmic conversion transistor 102 is output as a reset signal to the column output line 213.

The reset signal contains a variation in the characteristics of the logarithmic conversion transistor 102 (more specifically, also a variation in the characteristics of the pixel amplifier). Therefore, a subsequent CDS circuit (not shown) is used to cancel the characteristics variation of the logarithmic conversion MOS transistor 102 in each pixel, resulting in a reduction in the fixed pattern noise. At time t4 and thereafter, the switch portion 416 is OFF so that the gate electrode 103 is caused to be in the floating state, and an ordinary photodetection is continued until the next read operation (after one frame period).

In the photodetector device 600, at time t3 of FIG. 8, the row selection switch portion 412 is switched ON to output a reset signal so that the photodiode 101 and the source electrode 105 are separated. In this case, the reset signal is not affected by a photocurrent, resulting in the reset signal having a more accurate voltage value. Other operations of the photodetector device 600 are the same as those of the photodetector device 600*a*.

Embodiment 4

Figure 9:
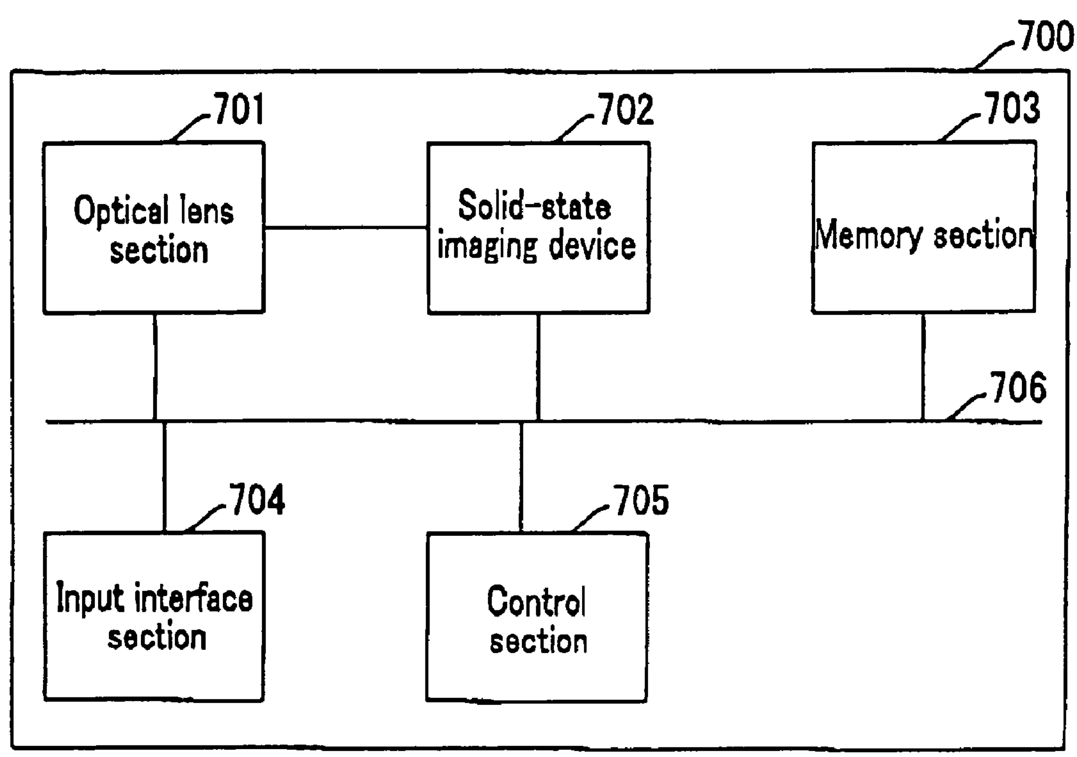
FIG. 9 is a diagram showing a camera system according to Embodiment 4 of the present invention.
Figure 10:
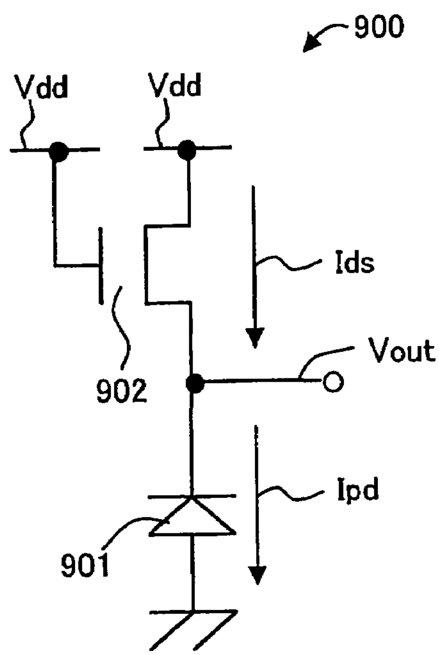
FIG. 10 is a diagram showing a conventional photodetector device.
Figure 11:
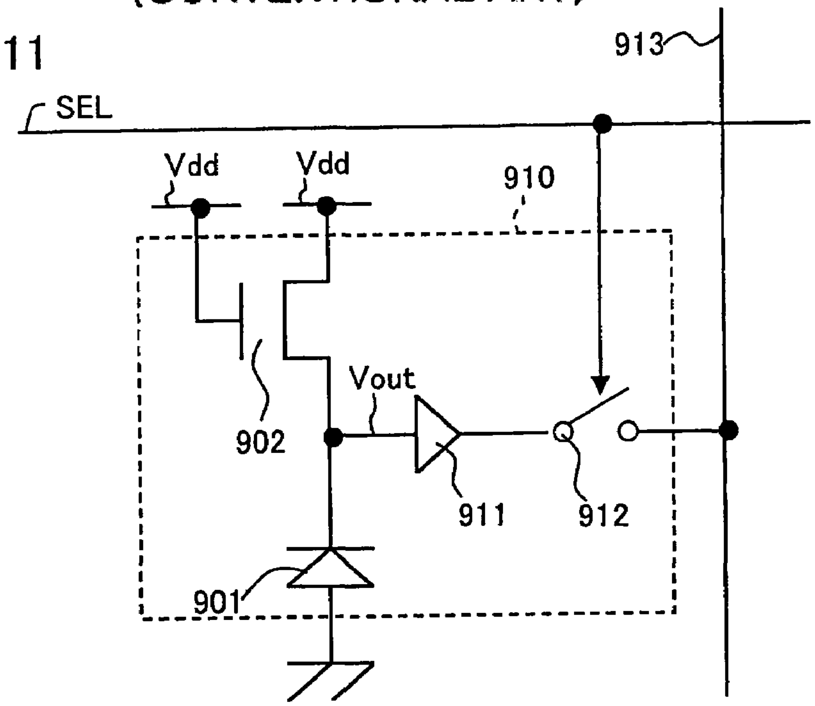
FIG. 11 is a diagram showing another conventional photodetector device.
Figure 12:
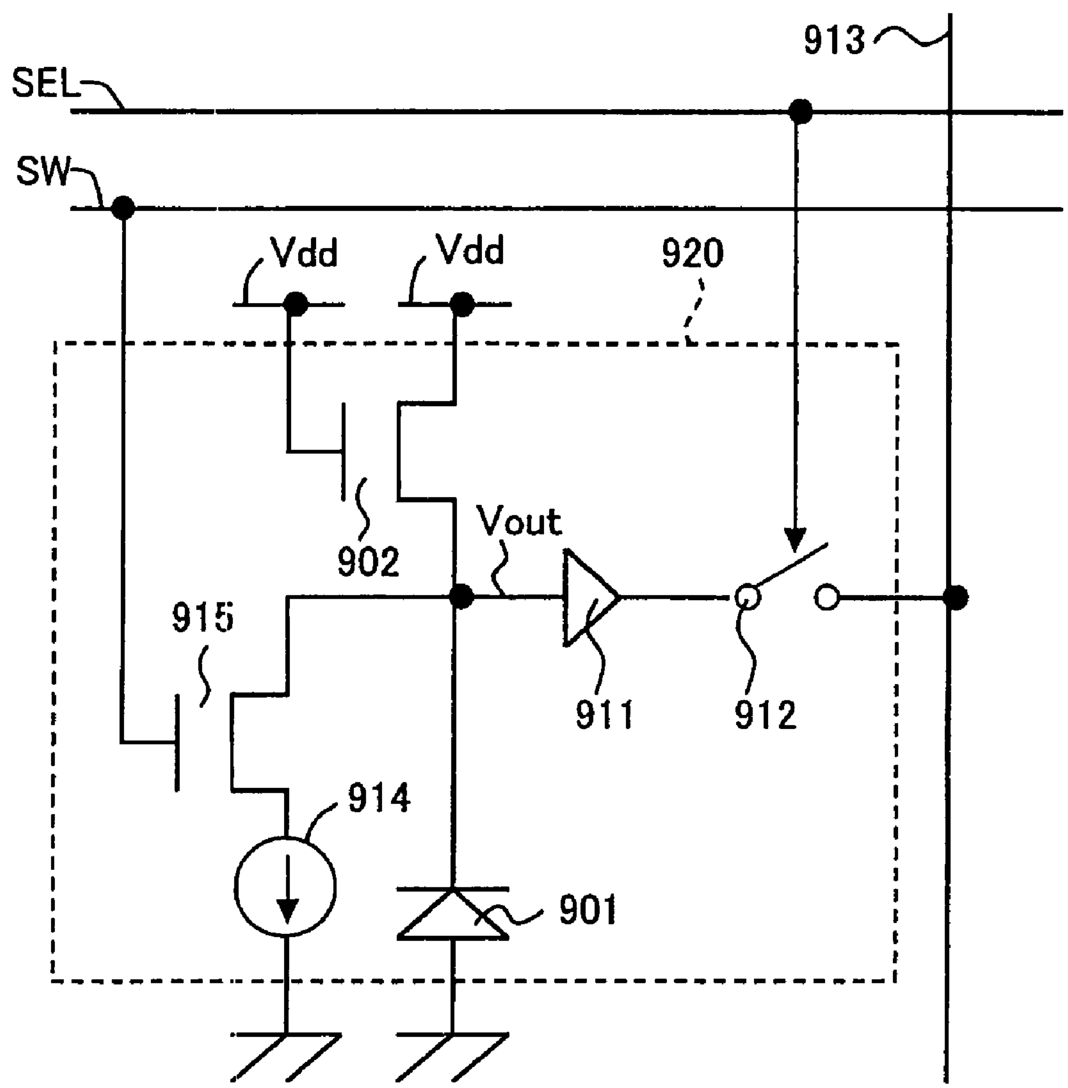
FIG. 12 is a diagram showing still another conventional photodetector device.

FIG. 9 shows a camera system 700 according to Embodiment 4 of the present invention. The camera system 700 is, for example, a camcorder, a digital camera, a personal digital assistant, a scanner, a facsimile, or the like.

The camera system 700 comprises an optical lens section 701, a solid-state imaging device 702, a memory section 703, an input interface section 704, a control section 705, and a bus 706. The bus 706 connects these components.

The optical lens section 701 collects incident light input from the outside. The solid-state imaging device 702 receives the light collected by the optical lens section 701, and converts the received light to an image signal. The memory section 703 stores image information indicated by the image signal. The input interface section 704 outputs an instruction input from the user to the control section 705. In response to the user's instruction, the control section 705 controls operations of the optical lens section 701, the solid-state imaging device 702, the memory section 703, and the input interface section 704. The solid-state imaging device 702 is, for example, the solid-state imaging device 200 or 300 described in Embodiment 2 and 3. The camera system 700 comprises the above-described high-sensitivity solid-state imaging device 200 or 300, thereby making it possible to obtain an image having high image quality.

According to the present invention, when the logarithmic conversion transistor subjects the voltage value of an electrical signal generated by the photodiode to logarithmic conversion, the voltage of the gate electrode of the logarithmic conversion transistor is caused to be in a floating state. Therefore, the voltage value of the electrical signal generated by the photodiode can have a large dynamic range, and the amount of change in voltage value of the electrical signal in association with a change in the amount of incident light can be increased. As a result, a high-sensitivity photodetector device can be achieved, thereby making it possible to obtain an image having a high image quality.

Thus, the present invention is useful for the fields of a photodetector device, a solid-state imaging device and a camera system.

Although certain preferred embodiments have been described herein, it is not intended that such embodiments be construed as limitations on the scope of the invention except as set forth in the appended claims. Various other modifications and equivalents will be apparent to and can be readily made by those skilled in the art, after reading the description herein, without departing from the scope and spirit of this invention. All patents, published patent applications and publications cited herein are incorporated by reference as if set forth fully herein.

What is claimed:

1. A photodetector device, comprising:

a photodiode for generating an electrical signal corresponding to an amount of incident light; and a logarithmic conversion transistor for subjecting a voltage value of the electrical signal to logarithmic conversion, wherein the logarithmic conversion transistor comprises a first electrode which is one of a source electrode and a drain electrode, a second electrode which is the other of the source electrode and the drain electrode, and a gate electrode, the first electrode is connected to the photodiode, a first voltage is applied to the second electrode so that the logarithmic conversion transistor operates in a subthreshold region, and the photodetector device further comprising a section for causing a voltage of the gate electrode to be in a floating state when the logarithmic conversion transistor subjects the voltage value of the electrical signal to logarithmic conversion, wherein a capacitance between the first electrode and the gate electrode is larger than a capacitance between the second electrode and the gate electrode.

2. A photodetector device according to claim 1, wherein a width of an overlap between the gate electrode and the first electrode is greater than a width of an overlap between the gate electrode and the second electrode.

3. A photodetector device according to claim 1, wherein an area of an overlap between the gate electrode and the first electrode is larger than an area of an overlap between the gate electrode and the second electrode.

4. A photodetector device according to claim 2, wherein an area of an overlap between the gate electrode and the first electrode is larger than an area of an overlap between the gate electrode and the second electrode.

5. A photodetector device according to claim 1, further comprising:

an amplifier section for amplifying the electrical signal having the voltage value which has been subjected to logarithmic conversion by the logarithmic conversion transistor; and a first switch portion connected to the amplifier section, wherein the amplifier section outputs the amplified electrical signal via the first switch portion.

6. A photodetector device according to claim 1, wherein the section for causing the voltage of the gate electrode to be in the floating state is a second switch portion connected to the gate electrode, when the second switch portion is ON, a second voltage is applied to the gate electrode, and when the second switch portion is OFF, the voltage of the gate electrode is caused to be in the floating state.

7. A photodetector device according to claim 6, further comprising:

a constant current power source section for generating a constant current; and a third switch portion connected to the first electrode and the constant current power source section, wherein when the third switch portion is ON, the constant current is input to the first electrode.

8. A photodetector device according to claim 6, wherein when the second switch portion and the third switch portion are ON, the logarithmic conversion transistor generates a reset signal.

9. A photodetector device according to claim 6, wherein when the second switch portion is ON and the first voltage goes to a high level after having once been lowered to a low level, the logarithmic conversion transistor generates a reset signal.

10. A photodetector device according to claim 6, further comprising:

a fourth switch portion connected to the first electrode and the photodiode, wherein when the fourth switch portion is ON, the electrical signal is input to the first electrode.

11. A photodetector device according to claim 10, wherein when the fourth switch portion is OFF, the logarithmic conversion transistor generates a reset signal.

12. A solid-state imaging device, comprising a plurality of photodetector devices, wherein each of the plurality of photodetector devices comprises:

a photodiode for generating an electrical signal corresponding to an amount of incident light; and a logarithmic conversion transistor for subjecting a voltage value of the electrical signal to logarithmic conversion, wherein the logarithmic conversion transistor comprises a first electrode which is one of a source electrode and a drain electrode, a second electrode which is the other of the source electrode and the drain electrode, and a gate electrode, the first electrode is connected to the photodiode, a first voltage is applied to the second electrode so that the logarithmic conversion transistor operates in a subthreshold region, and the photodetector device further comprising a section for causing a voltage of the gate electrode to be in a floating state when the logarithmic conversion transistor subjects the voltage value of the electrical signal to logarithmic conversion, wherein a capacitance between the first electrode and the gate electrode is larger than a capacitance between the second electrode and the gate electrode.

13. A camera system, comprising a solid-state imaging device, wherein the solid-state imaging device comprises a plurality of photodetector devices, each of the plurality of photodetector devices comprises:

a photodiode for generating an electrical signal corresponding to an amount of incident light; and a logarithmic conversion transistor for subjecting a voltage value of the electrical signal to logarithmic conversion, wherein the logarithmic conversion transistor comprises a first electrode which is one of a source electrode and a drain electrode, a second electrode which is the other of the source electrode and the drain electrode, and a gate electrode, the first electrode is connected to the photodiode, a first voltage is applied to the second electrode so that the logarithmic conversion transistor operates in a subthreshold region, and the photodetector device further comprising a section for causing a voltage of the gate electrode to be in a floating state when the logarithmic conversion transistor subjects the voltage value of the electrical signal to logarithmic conversion, wherein a capacitance between the first electrode and the gate electrode is larger than a capacitance between the second electrode and the gate electrode.

* * * * *